(12) United States Patent
Canfield et al.

(10) Patent No.: US 7,997,918 B2
(45) Date of Patent: Aug. 16, 2011

(54) ACTUATION DEVICE HAVING COMBINED MECHANISMS TO MATCH A DESIRED CONNECTOR PLUGGING CURVE AND METHOD FOR ACTUATING A POWER SUPPLY THEREWITH

(75) Inventors: Shawn Canfield, Poughkeepsie, NY (US); Michael F. Scanlon, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 993 days.

(21) Appl. No.: 11/861,400

(22) Filed: Sep. 26, 2007

(65) Prior Publication Data

US 2009/0078068 A1 Mar. 26, 2009

(51) Int. Cl.
*H01R 13/62* (2006.01)
(52) U.S. Cl. ......... 439/310; 439/153; 439/157; 439/372
(58) Field of Classification Search .............. 439/310, 439/153, 157, 372
See application file for complete search history.

(56) References Cited

U.S. PATENT DOCUMENTS

| | | | |
|---|---|---|---|
| 5,317,481 A | 5/1994 | Hillis et al. | |
| 5,815,377 A | 9/1998 | Lund et al. | |
| 5,868,585 A | 2/1999 | Barthel et al. | |
| 5,967,824 A | 10/1999 | Neal et al. | |
| 6,115,258 A | 9/2000 | Hoyle, Jr. et al. | |
| 6,210,184 B1 | 4/2001 | Kodama et al. | |
| 6,283,781 B1 * | 9/2001 | Mori | 439/310 |
| 6,411,517 B1 | 6/2002 | Babin | |
| 6,425,706 B1 | 7/2002 | Jalanti et al. | |
| 6,667,890 B1 | 12/2003 | Barringer et al. | |
| 6,671,184 B1 | 12/2003 | Barringer et al. | |
| 6,816,383 B2 | 11/2004 | Barringer et al. | |
| 6,930,892 B2 | 8/2005 | Barringer et al. | |
| 6,956,746 B2 * | 10/2005 | Barsun et al. | 361/785 |
| 6,971,893 B2 | 12/2005 | Barringer et al. | |
| 7,083,477 B1 | 8/2006 | Brodsky et al. | |
| 7,127,791 B2 | 10/2006 | Barringer et al. | |
| 7,192,040 B2 * | 3/2007 | Xie | 280/93.502 |
| 7,435,114 B2 * | 10/2008 | Desrosiers et al. | 439/157 |
| 2005/0243533 A1 | 11/2005 | Malone et al. | |
| 2008/0014779 A1 | 1/2008 | Lee et al. | |
| 2008/0124960 A1 * | 5/2008 | Jur et al. | 439/114 |
| 2009/0088008 A1 * | 4/2009 | Bandholz et al. | 439/73 |

OTHER PUBLICATIONS

Barringer et al, "Screw Drive Connector Actuation Mechanism", U.S. Appl. No. 12/035,595, application (specification, claims, abstract and figures) having 20 pages, filed Feb. 22, 2008.

* cited by examiner

*Primary Examiner* — Gary F. Paumen
(74) *Attorney, Agent, or Firm* — Cantor Colburn LLP; John Campbell

(57) ABSTRACT

An actuation device includes a frame, a linkage mechanism and a handle mechanism. The handle mechanism includes a handle and a connection link, each having a first end and an opposite second end. The first end of the handle is pivotally connected to the frame. The first end of the connection link is pivotally connected to the handle and the second end of the connection link is pivotally connected to the linkage mechanism. Movement of the second end of the handle rotates the handle about an axis determined by a connection point of the first end of the handle to the frame and results in movement of the connection link in a first direction causing translation of the linkage mechanism in a second direction substantially perpendicular to the first direction to mechanically and electrically connect a power supply to an outside circuit through an opening of the frame.

16 Claims, 5 Drawing Sheets

ACTUATION DEVICE HAVING COMBINED MECHANISMS TO MATCH A DESIRED CONNECTOR PLUGGING CURVE AND METHOD FOR ACTUATING A POWER SUPPLY THEREWITH

FIELD OF THE INVENTION

The present invention relates generally to actuation devices. More particularly, the present invention is directed to an actuation device having combined mechanisms to provide an improved mechanical advantage to match a desired connector plugging curve.

BACKGROUND OF THE INVENTION

It is a goal of the computer industry to continuously increase a number of electronic components inside an electronic device. This goal is driven by several important reasons. An obvious reason is for convenience arising from compactness. Compactness allows for selective fabrication of smaller and lighter electronic devices which appeal to consumers. Such appeal stems from a desire for easier transportation, shipping, installation and storage, for example, of such electronic devices. In other instances, when compactness per se is not a driving factor, providing a given number of electronic components in only a fraction of available footprint within an electronic device allows remaining space in the electronic device to be used for other components which increase system performance and speed. In addition, compactness allows many circuits of the electronic components to operate at higher frequencies and at higher speeds, due to shorter electrical distances between the electronic components. Unfortunately, despite the advantages associated with this computer industry goal, there are several important challenges, often related to space concerns, which have to be overcome by the designers of electronic devices and systems.

In high density power packaging, for example, very little mechanical space is allocated for use in actuation of mating connectors of a power supply. Further, the mating connectors require high forces (e.g., greater than 100 lbf) and must be actuated by blind swapping. As a result, lead screws and wedge mechanisms are currently used in actuation devices to actuate mating connectors therein. However, these lead screw and wedge mechanisms require mechanical keepout areas which consume board surface area. Furthermore, to accommodate the lead screw and wedge mechanisms, actuation devices are often packaged in irregular card sizes and shapes, and typically have varying packaging heights.

Another disadvantage associated with actuation devices using lead screw and wedge mechanisms is that such actuation devices maintain a high mechanical advantage throughout a complete duration of a connector stroke. Since the high mechanical advantage is only required while actually engaging connectors, actuation time is thereby unnecessarily increased in actuation devices using lead screw and wedge mechanisms. In addition, complex, machined components are often required in actuation devices using lead screw and wedge mechanisms. Finally, actuation devices using lead screw and wedge mechanisms require tools for actuation, e.g., a screwdriver or other similar tool is required to turn a lead screw.

Accordingly, a need exists for a thin and compact actuation device. The actuation device should have a mechanical advantage sufficient to develop high actuation forces (e.g., greater than 100 lbf) without using lead screws, wedge mechanisms or tools. In addition, it is desired that the high actuation forces be developed only during a portion of actuator travel wherein connector plugging occurs, thereby increasing actuation speed of the actuation device.

SUMMARY OF THE INVENTION

The foregoing discussed drawbacks and deficiencies of the prior art are overcome or alleviated by an exemplary embodiment of an actuation device. The actuation device according to an exemplary embodiment includes a frame defining a housing cavity for movably containing the power supply, a linkage mechanism disposed in the housing cavity and pivotally connected to the frame, and a handle mechanism pivotally connected to each of the frame and the linkage mechanism.

The frame has an opening to receive the power supply therethrough.

The handle mechanism includes a handle having a first end and an opposite second end, and a connection link having a first end and an opposite second end. The first end of the handle is pivotally connected to the frame, while the first end of the connection link is pivotally connected to the handle intermediate to each of the first end and the second end of the handle, and the second end of the connection link is pivotally connected to the linkage mechanism.

Movement of the second end of the handle rotates the handle about an axis determined by a connection point of the first end of the handle to the frame and results in movement of the connection link in a first direction, thereby causing translation of the linkage mechanism in a second direction substantially perpendicular to the first direction to mechanically and electrically connect the power supply to an outside circuit through the opening of the frame.

In an alternative exemplary embodiment, an apparatus includes an electrical device, a power supply and an actuation device. The actuation device includes a frame defining a housing cavity for movably containing the power supply, a linkage mechanism disposed in the housing cavity and pivotally connected to the frame, and a handle mechanism pivotally connected to each of the frame and the linkage mechanism. The frame has an opening to receive the power supply therethrough.

The handle mechanism includes a handle having a first end and an opposite second end and a connection link having a first end and an opposite second end. The first end of the handle is pivotally connected to the frame. The first end of the connection link is pivotally connected to the handle intermediate to each of the first end and the second end of the handle, and the second end of the connection link is pivotally connected to the linkage mechanism.

Movement of the second end of the handle rotates the handle about an axis determined by a connection point of the first end of the handle to the frame and results in movement of the connection link in a first direction, causing translation of the linkage mechanism in a second direction substantially perpendicular to the first direction to mechanically and electrically connect the power supply to an outside circuit through the opening of the frame.

In yet another alternative exemplary embodiment, a method for actuating a power supply into an electrical device includes: movably containing a power supply in a frame having an opening to receive the power supply therethrough; pivotally connecting a linkage mechanism to the frame; pivotally connecting a handle mechanism to each of the frame and the linkage mechanism, the handle mechanism including a handle and a connection link, each having a first end and an opposite second, wherein the first end of the handle is pivotally connected to the frame, the first end of the connection link is pivotally connected to the handle intermediate to the first end of the handle and the second end of the handle, and the second end of the connection link is pivotally connected to the linkage mechanism; and rotating the second end of the handle about an axis determined by a connection point of the first end of the handle to the frame to move the connection link in a first direction, thereby causing translation of the linkage mechanism in a second direction substantially perpendicular to the first direction to mechanically and electrically connect the power supply to an outside circuit through the opening of the frame.

BRIEF DESCRIPTION OF THE DRAWINGS

Referring now to the figures, which are exemplary embodiments, and wherein the like elements are numbered alike.

DETAILED DESCRIPTION OF THE INVENTION

Figure 1:
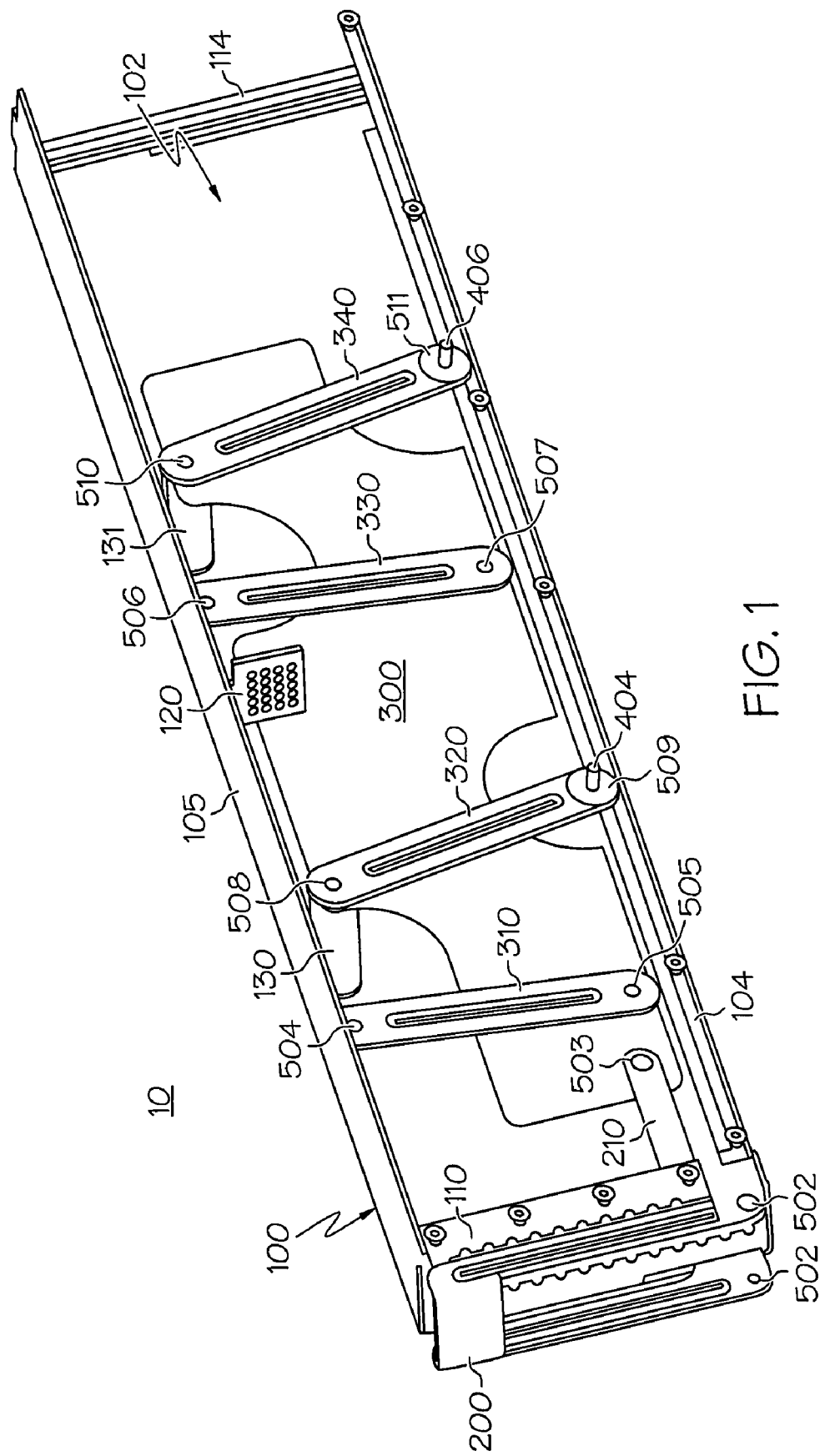
FIG. 1 is a perspective view of an actuation device in accordance with an embodiment of the invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below. Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Figure 2:
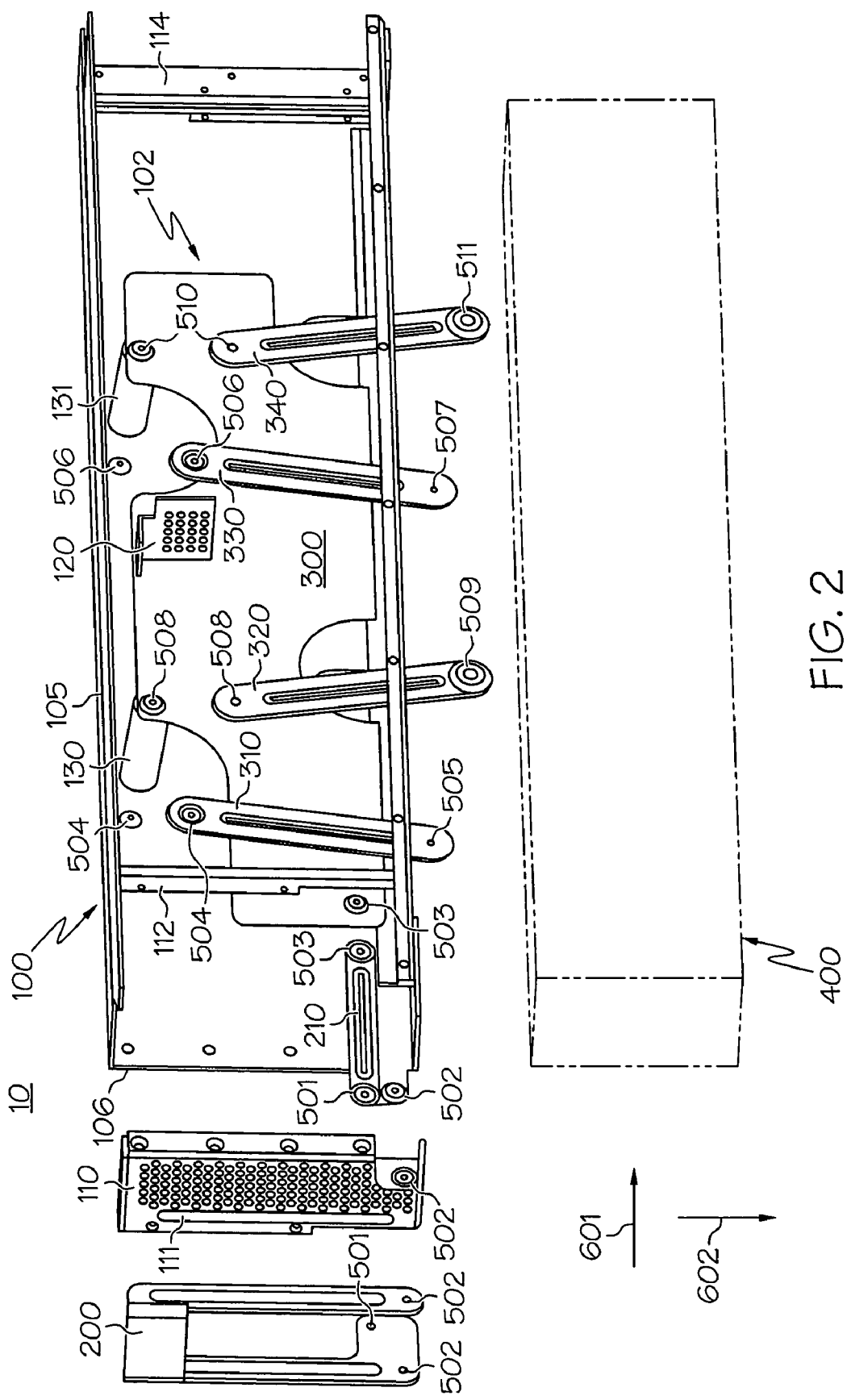
FIG. 2 is an exploded overall view of an actuation device in accordance with an embodiment of the invention.

Referring generally to FIGS. 1 and 2, an actuation device 10 for actuation of mating connectors of a power supply 400 (FIG. 2 only), for example, into a board of a computer server (not shown) in accordance with an embodiment of the invention includes a frame 100, a handle 200, a connection link 210, a linkage plate 300, a first actuation link 310, a second actuation link 320, a third actuation link 330 and a fourth actuation link 340. The frame 100 defines a housing cavity 102 wherein the power supply 400 is moveably mounted. Further, the connection link 210, the linkage plate 300, the first actuation link 310, the second actuation link 320, the third actuation link 330 and the fourth actuation link 340 are disposed within the housing cavity 102, as shown in FIGS. 1 and 2. A bottom 104 of the frame 100 has an opening through which the power supply 400 is received. In addition, a side 106 of the frame has a first cutout 130 and a second cutout 131 each corresponding to a range of motion, discussed later in further detail, of a respective upper portion of each of the second actuation link 320 and the third actuation link 340.

Referring to FIG. 2, a first guide 112 and a second guide 114 are disposed in the housing cavity 102 of the frame 100. The first guide 112 and the second guide 114 maintain an alignment of the power supply 400 within the housing cavity 102.

An airflow baffle 120 is disposed on a top surface 105 of the frame 100. The airflow baffle 120 controls a flow of air within the housing cavity 102.

Referring again to FIGS. 1 and 2, a tailstock 110 is attached to the frame 100. The tailstock 110 has an opening 111 (FIG. 2 only) through which a portion of the handle 200 may pass to pivotally connect to a first end of the connection link 210. More specifically, a middle portion of the handle 200, e.g., a portion intermediate to an upper portion and an opposite lower portion of the handle 200, is pivotally connected to the first end of the connection link 210 at a first pivot point 501 (FIG. 2 only). Further, the lower portion of the handle 200 is pivotally connected to the tailstock 110 at a second pivot point 502 to effectively connect the handle 200 to the frame 100 via the tailstock 110. As a result, when a force applied to the upper portion of the handle 200 causes the handle to pivot clockwise, e.g., upward toward a position of the handle 200 as shown in FIGS. 1 and 2, in an arc centered on the second pivot point 502. The clockwise pivoting of the handle 200 causes the connection link 210 to move in a first direction 601 along a substantially longitudinal axis of the frame 100, since the link 210 is pivotally connected to the handle 200 at the first pivot point 501.

In an exemplary embodiment of the present invention, a range of motion of the arc of the handle 200 is limited to about 90 degrees. More specifically, the range of motion of the arc of the handle 200 is limited to motion between a first point where the handle 200 contacts the tailstock 110, e.g., the handle 200 is aligned in a second direction 602 substantially perpendicular to the first direction 601, and a second point where further motion of the handle 200 in the second direction 602, e.g., counterclockwise with respect to FIG. 2, is prevented by a length of the connection link 210 and/or a location of the first pivot point 501.

Still referring to FIGS. 1 and 2, a second end of the connection link 210, opposite to the first end of the connection link 210, is pivotally connected to a lower lateral portion the linkage plate 300, e.g., a lateral portion of the linkage plate 300 closer to the bottom 104 of the frame 100 than an opposite upper lateral portion of the linkage plate 300, at a third pivot point 503. As a result, motion of the second end of the connection link 210, e.g., longitudinal translation of the third pivot point 503, results in corresponding motion of the linkage plate 300 in a corresponding substantially similar direction.

The first actuator link 310 has a first end and an opposite second end. The first end of the first actuator link 310 is pivotally connected to the frame 100 at a fourth pivot point 504, which is disposed adjacent to the top 105 of the frame 100, as shown in FIGS. 1 and 2. The second end of the first actuator link 310 is pivotally connected to a fifth pivot point 505 on the lower lateral portion of the linking plate 300.

Likewise, the third actuator link 330 has a first end and an opposite second end. The first end of the first actuator link 330 is pivotally connected to the frame 100 at a sixth pivot point 506, which is adjacent to the top 105 of the frame 100 at a location which is a further longitudinal distance in the first direction 601 from the handle 200 than the first actuator link 501, as shown in FIGS. 1 and 2. The second end of the third actuator link 330 is pivotally connected to a seventh pivot point 507 on the lower lateral portion of the linking plate 300, also at a location which is a further longitudinal distance in the first direction 601 from the handle 200 than the first actuator link 501.

The second actuator link 320 has a first end and an opposite second end. The second actuator link 320 is disposed longitudinally between the first actuator link 310 and the third actuator link 330, as shown in FIGS. 1 and 2. However, the first end of the second actuator link 320 is pivotally connected to the upper portion of the linkage plate 300 at an eighth pivot point 508 corresponding to the first cutout 130 of the side 106 of the frame 100, while the second end of the second actuator link 320 is pivotally connected to the power supply 400 with a first pin 404 (FIG. 1 only) at a ninth pivot point 509.

Similarly, the fourth actuator link 340 has a first end and an opposite second end. Further, the fourth actuator link 340 is disposed longitudinally farther from the third actuator link 330 from the handle 200, as shown in FIGS. 1 and 2. The first end of the fourth actuator link 340 is pivotally connected to the upper portion of the linkage plate 300 at a tenth pivot point 510 corresponding to the second cutout 131 of the side 106 of the frame 100, while the second end of the fourth actuator link 340 is pivotally connected to the power supply 400 with a second pin 406 (FIG. 1 only) at an eleventh pivot point 511.

It will be noted that while the power supply 400 is pivotally connected to the second actuator link 320 and the fourth actuator link 340 with the first pin 404 and the second pin 406, respectively, the power supply 400 may be pivotally connected to the second actuator link 302 and the fourth actuator link 304 by alternative means such as a roller or a hinge, for example, but is not limited thereto in alternative exemplary embodiments of the present invention.

An operation of the actuation device 10 according to an exemplary embodiment of the present invention will now be described in further detail with respect to FIGS. 1 and 2. Hereinafter, the handle 200 and the connection link 210 will be collectively referred to as a handle mechanism, while the linkage plate 300, the first actuation link 310, the second actuation link 320, the third actuation link 330 and the fourth actuation link 340 will be collectively referred to as a linkage mechanism.

First, an operation wherein the actuation device 10 physically and electrically connects mating connectors of the power supply 400 to an outside electrical device such as a computer server (not shown), for example, but not being limited thereto, will be described in further detail. Initially, the handle 200 is in a down position, e.g., is in a position 90 degrees counterclockwise from vertical with respect to a longitudinal plane of the tailstock 110 in FIGS. 1 and 2. When a force is applied to the upper portion of the handle 100, the upper portion of the handle 100 pivots clockwise in an arc toward the tailstock 110, e.g., the handle 200 moves about 90 degrees toward the tailstock 110 to an "up" position, and the connection link 210 moves in substantially the first direction 601, as described in greater detail above. As a result, the first actuation link 310 and the third actuation link 330 rotate in a counterclockwise direction, tending to move the linking plate 300 in the first direction 601. This movement of the linking plate 300 in the first direction 601 causes a corresponding movement of each of the first ends of the second actuation link 302 and the fourth actuation link 304. However, since each of the first ends of the second connection link 302 and the fourth connection link 304 are disposed in the first cutout 130 and the second cutout 131, respectively, of the frame 100 and are thereby free to rotate in the clockwise direction, the net result of the movement of the linking plate 300 and the clockwise rotation of the second connection link 302 and the fourth connection link 304 is to cause the second ends of the second connection link 304 and the fourth connection link 304, e.g., the ninth pivot point 509 and the eleventh pivot point 511 connected to the power supply 400, to move in the second direction 602, thereby physically and electrically connecting the mating connectors of the power supply 400 to the outside electrical device.

An operation wherein the actuation device 10 physically and electrically disconnects the mating connectors of the power supply 400 from an outside electrical device (not shown) is essentially a reverse of the operation described above. More specifically, the handle 200 is initially in the "up" position, and a force is applied to the handle 200 to rotate the upper portion of the handle 200 counterclockwise, e.g., away from the tailstock 110. As result, the connection link 210 pulls the linking plate 300 in a direction substantially opposite to the first direction 601, thereby rotating the first actuation link 310 and the third actuation link 330 in a clockwise direction, causing the first ends of the second actuation link 302 and the fourth actuation link 304 to move upward in the first cutout 130 and the second cutout 131, respectively. As a result, the second ends of the second actuation link 302 and the fourth actuation link 304, e.g., the ninth pivot point 509 and the eleventh pivot point 511, respectively, connected to the power supply 400 move in a direction substantially opposite to the second direction 602, thereby physically and electrically disconnecting the mating connectors of the power supply 400 from the outside electrical device.

In summary, to connect or disconnect mating connectors of the power supply 400 to or from the outside electrical device, a force is applied, by an operator, for example, to the handle 200 of the handle mechanism. Since the handle mechanism is connected to the linking mechanism, the force applied to the handle mechanism translates to the linking mechanism, thereby causing the second ends of the second actuation link 302 and the fourth actuation link 304 to move in either the second direction 602, thereby connecting the power supply 400 to the outside electrical device, or in a direction substantially opposite to the second direction 602, thereby disconnecting the power supply 400 from the outside electrical device.

Thus, in an exemplary embodiment of the present invention, a handle mechanism and a linkage mechanism are combined to provide an actuation device. Furthermore, the actuation device having the combined handle mechanism and the linkage mechanism generates a specific force curve corresponding to a predetermined mating connector force curve and having a high mechanical advantage without requiring lead screw and/or wedge mechanisms or tools for operation. In addition, the high mechanical advantage is applied only during connector plugging, allowing quick operation of the handle mechanism during a portion of an actuation stroke when the high mechanical advantage is not needed, e.g., when connector plugging is not performed.

Other advantages flow from exemplary embodiments of the present invention, as well. For example, the actuation device of the present invention is relatively small and thin as compared to actuation devices of the prior art which require lead screw and/or wedge mechanisms to develop a required high mechanical advantage. Furthermore, package sizes of the actuation device according to exemplary embodiments of the present invention are uniform in size and shape, thereby effectively maximizing efficient use of board space in electrical device such as computer servers, for example, but not being limited thereto.

Finally, in an actuation device of the present invention, a specific force curve may be chosen to correspond to a desired mating connector force curve by selecting predetermined link lengths and swing angles in the handle mechanism and/or the linkage mechanism.

In an experiment, an actuation device according to an exemplary embodiment of the present invention was designed and kinematically tested to confirm the aspects, features and advantages described above. More specifically, the experiment tested an exemplary embodiment of the present invention to determine whether a high connector force, e.g., about 100 lbf, could be generated by a relatively low handle force, e.g., about 10 lbf or a mechanical advantage of about 10, with the high connector force being generated only during connector engagement, e.g., a final about 5 mm of travel of an about 20 mm total connector travel distance.

Figure 3:
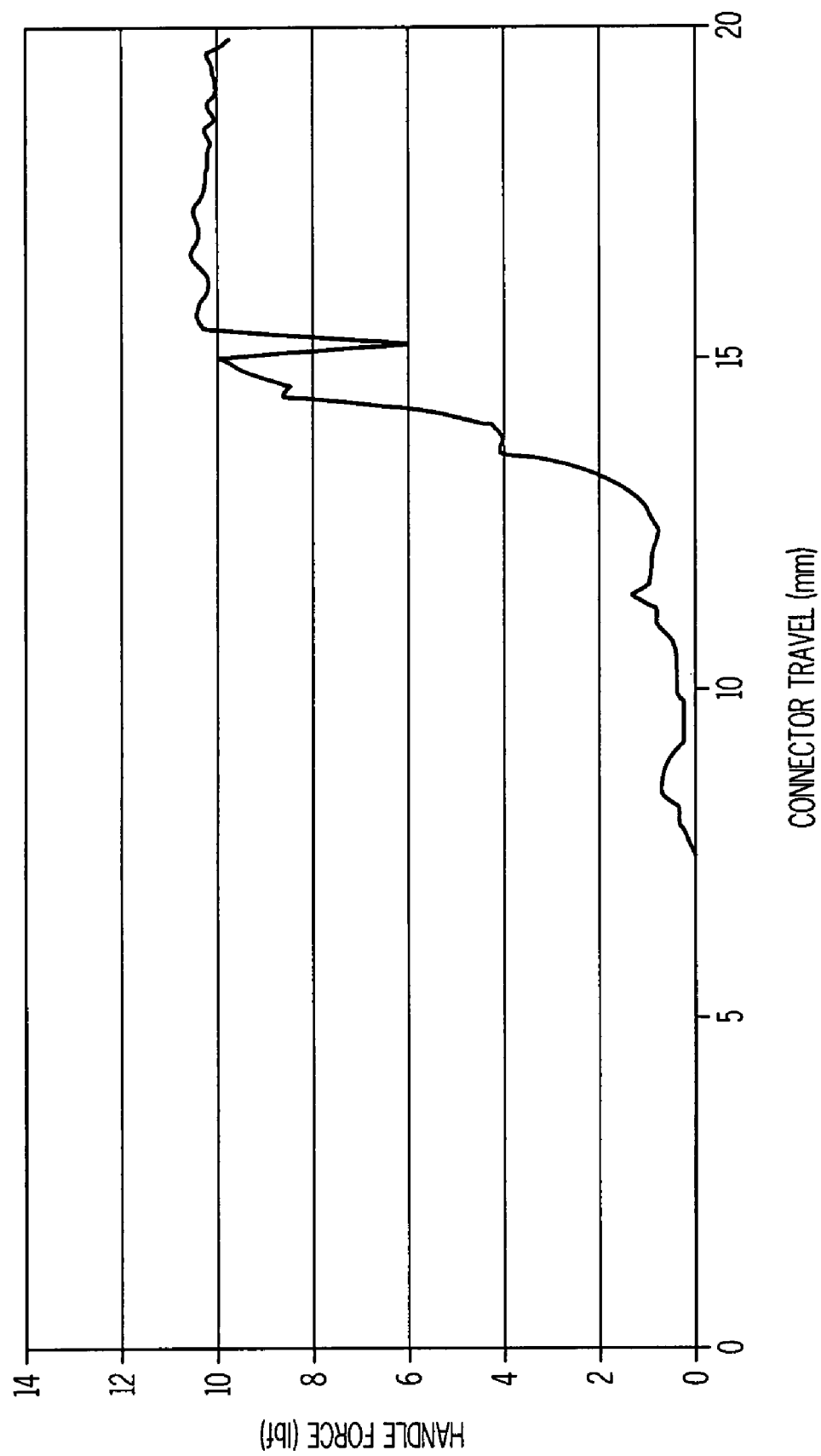
FIG. 3 is a graph of handle force versus connector travel in an actuation device in accordance with an embodiment of the invention.
Figure 4:
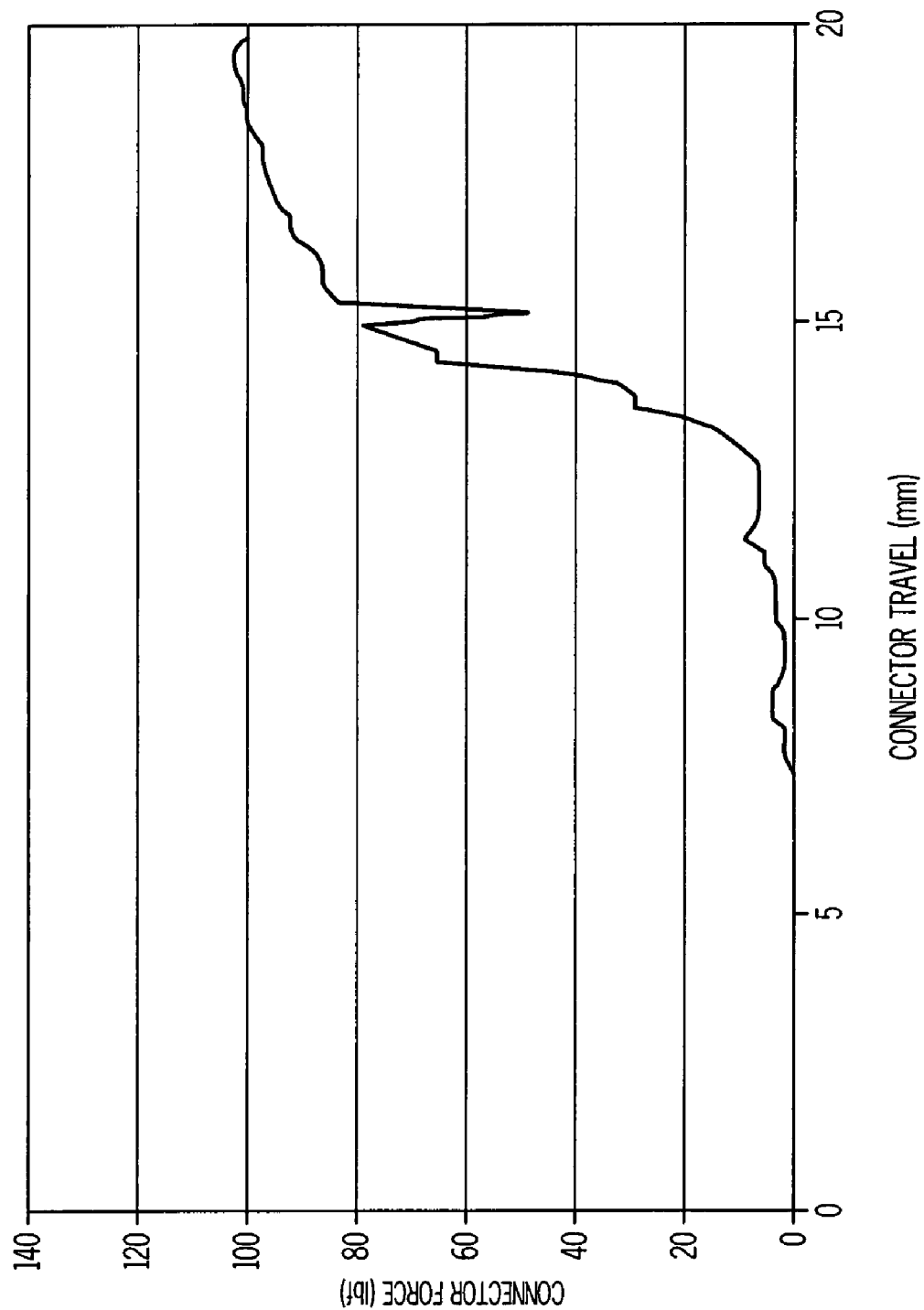
FIG. 4 is a graph of connector force versus connector travel in an actuation device in accordance with an embodiment of the invention.
Figure 5:
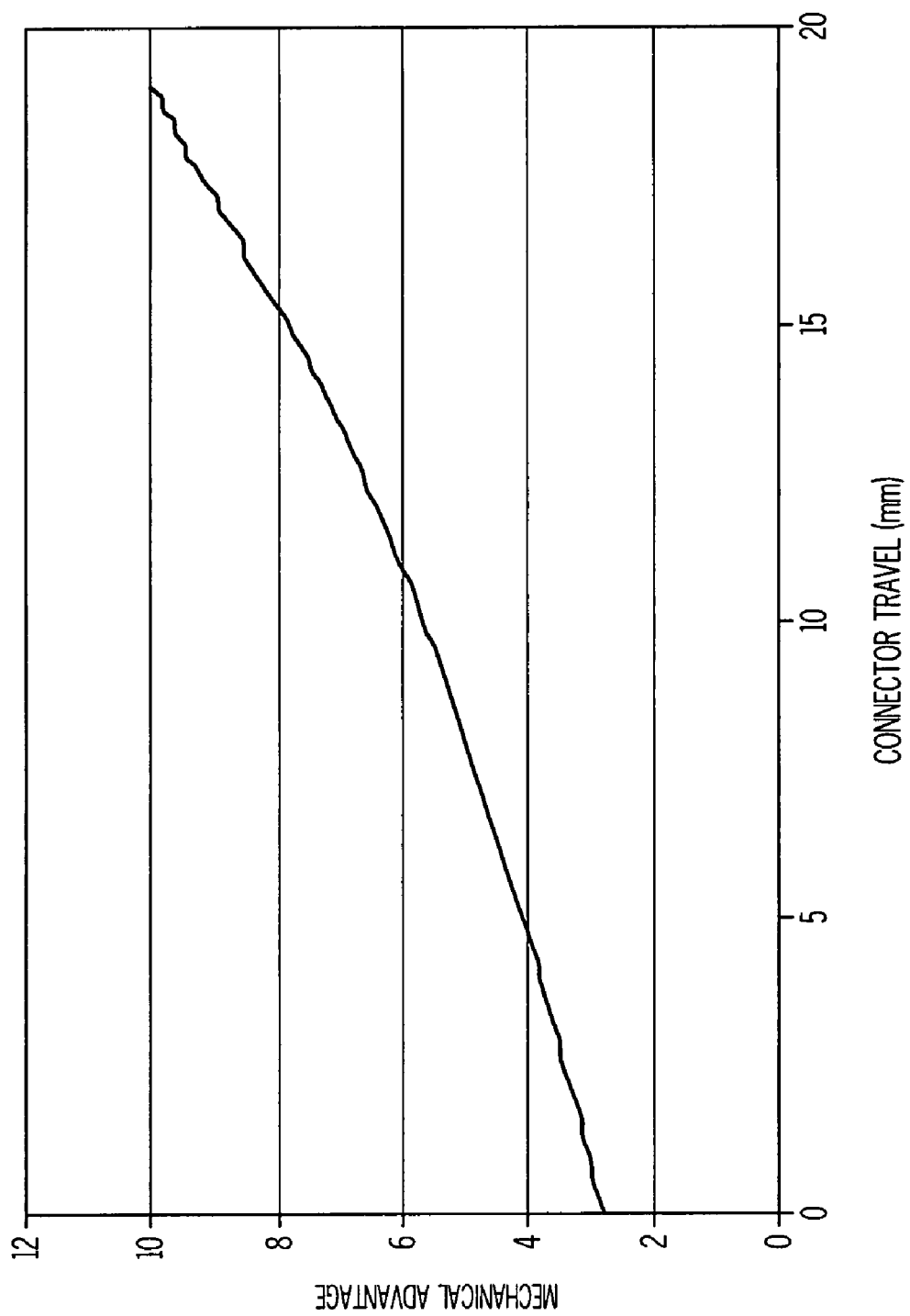
FIG. 5 is a graph of mechanical advantage versus connector travel in an actuation device in accordance with an embodiment of the invention.

FIGS. 3 through 5 illustrate the results of the kinematics testing for the experiment. Referring to FIGS. 3 through 5, it is seen that an actuation device according to an exemplary embodiment generates high connector forces during a final portion of an overall connector travel distance with a relatively small handle force.

More specifically, FIG. 3 shows that a handle force required during connector engagement, e.g., connector travel between about 15 mm and about 20 mm, was about 10 lbf. Referring to FIG. 4, it can be seen that a resulting connector force of about 100 lbf was applied during the connector engagement, resulting in a mechanical advantage of about 10, as illustrated in FIG. 5.

Although exemplary embodiments of the present invention have been described in accordance with an actuation device as it relates to a power supply 400, it will be understood that the present invention is not limited thereto and that the present invention may be incorporated for providing an actuation device associated with any electrical device or apparatus.

Further, while the present invention has been particularly shown and described with reference to exemplary embodiments thereof, it will be understood by those skilled in the art that various changes may be made and equivalents may be substituted for elements thereof without departing from the spirit and/or scope of the present invention. In addition, many modifications may be made to adapt a particular situation or material to the teachings of the present invention without departing from the essential scope thereof.

For example, in an alternative exemplary embodiment of the present invention, a method for actuating a power supply into an electrical device includes movably containing a power supply in a frame having an opening to receive the power supply therethrough, pivotally connecting a linkage mechanism to the frame, and pivotally connecting a handle mechanism to each of the frame and the linkage mechanism. The handle mechanism has a connection link, a first end and an opposite second end, and the first end of the handle mechanism is pivotally connected to the frame, as described in greater detail above with reference to FIGS. 1 and 2. Further, a first end of the connection link is pivotally connected to the handle intermediate to the first end of the handle and the second end of the handle, and an opposite second end of the connection link is pivotally connected to the linkage mechanism. As a result, rotating the handle about an axis determined by a connection point of a first end of the handle to the frame moves the connection link in a first direction, thereby causing translation of the linkage mechanism in a second direction substantially perpendicular to the first direction to mechanically and electrically connect the power supply to an outside circuit through the opening of the frame.

Therefore, it is intended that the present invention not be limited to the particular exemplary embodiments disclosed herein, but that the invention will include all embodiments falling within the scope of the appended claims.

The invention claimed is:

1. An actuation device for a power supply, the actuation device comprising:
   a frame defining a housing cavity for movably containing the power supply, the frame having an opening to receive the power supply therethrough;
   a linkage mechanism disposed in the housing cavity and pivotally connected to the frame; and
   a handle mechanism pivotally connected to each of the frame and the linkage mechanism, the handle mechanism comprising:
      a handle having a first end and an opposite second end, the first end pivotally connected to the frame; and
      a connection link having a first end and an opposite second end, the first end pivotally connected to the handle intermediate to each of the first end and the second end of the handle, and the second end pivotally connected to the linkage mechanism, wherein movement of the second end of the handle rotates the handle about an axis determined by a connection point of the first end of the handle to the frame and results in movement of the connection link in a first direction causing translation of the linkage mechanism in a second direction substantially perpendicular to the first direction to mechanically and electrically connect the power supply to an outside circuit through the opening of the frame.

2. The actuation device of claim 1, wherein movement of the second end of the handle rotates the handle about an axis determined by a connection point of the first end of the handle to the frame and results in movement of the connection link in the first direction causing translation of the linkage mechanism in the second direction substantially perpendicular to the first direction to mechanically and electrically disconnect the power supply from an outside circuit through the opening of the frame.

3. The actuation device of claim 1, wherein the linkage mechanism comprises:
   a linkage plate having an upper portion and an opposite bottom portion;
   a first actuation link having a first end and an opposite second end, the first end pivotally connected to the frame and the second end pivotally connected to the bottom portion of the linkage plate;
   a second actuation link having a first end and an opposite second end, the first end pivotally connected to the upper portion of the linkage plate and the second end pivotally connected to the power supply;
   a third actuation link having a first end and an opposite second end, the first end pivotally connected to the frame and the second end pivotally connected to the bottom portion of the linkage plate; and
   a fourth actuation link having a first end and an opposite second end, the first end pivotally connected to the upper portion of the linkage plate and the second end pivotally connected to the power supply.

4. The actuation device of claim 2, wherein the frame further comprises:
   a first opening corresponding to a range of motion of a pivot point of the first end of the second actuation link of the linkage mechanism; and
   a second opening corresponding to a range of motion of a pivot point of the first end of the fourth actuation link of the linkage mechanism.

5. The actuation device of claim 1, wherein a range of an arc of motion of the second end of the handle about the axis determined by the connection point of the first end of the handle to the frame is about 90 degrees.

6. The actuation device of claim 1, wherein a ratio of an actuation force on the power supply to an input force on the handle to is greater than 1.

7. The actuation device of claim 6, wherein the ratio of the actuation force on the power supply to the input force on the handle to is about 10:1.

8. The actuation device of claim 1, wherein an actuation force on the power supply is about 100 pounds-force when an input force on the handle to is about 10 pounds-force.

9. An apparatus comprising an electrical device, a power supply and an actuation device, the actuation device comprising:
   a frame defining a housing cavity for movably containing the power supply, the frame having an opening to receive the power supply therethrough;
   a linkage mechanism disposed in the housing cavity and pivotally connected to the frame; and
   a handle mechanism pivotally connected to each of the frame and the linkage mechanism, the handle mechanism comprising:
      a handle having a first end and an opposite second end, the first end pivotally connected to the frame; and
      a connection link having a first end and an opposite second end, the first end pivotally connected to the handle intermediate to each of the first end and the second end of the handle, and the second end of the connection link pivotally connected to the linkage mechanism,
   wherein movement of the second end of the handle rotates the handle about an axis determined by a connection point of the first end of the handle to the frame and results in movement of the connection link in a first direction causing translation of the linkage mechanism in a second direction substantially perpendicular to the first direction to mechanically and electrically connect the power supply to an outside circuit through the opening of the frame.

10. The apparatus of claim 9, wherein the linkage mechanism of the actuation device comprises:
    a linkage plate having an upper portion and an opposite bottom portion;
    a first actuation link having a first end and an opposite second, the first end pivotally connected to the frame end and the second end pivotally connected to the bottom portion of the linkage plate;
    a second actuation link having a first end and an opposite second end, the first end pivotally connected to the upper portion of the linkage plate and the second end pivotally connected to the power supply;
    a third actuation link having a first end and an opposite second end, the first end pivotally connected to the frame and the second end pivotally connected to the bottom portion of the linkage plate; and
    a fourth actuation link having a first end and an opposite second end, the first end pivotally connected to the upper portion of the linkage plate and the second end pivotally connected to the power supply.

11. The apparatus of claim 9, wherein the power supply comprises a direct current (DC) power supply.

12. The apparatus of claim 9, wherein the electrical device comprises a computer server.

13. The apparatus of claim 9, wherein a ratio of the actuation force on the power supply to the input force on the handle to is greater than 1.

14. The apparatus of claim 13, wherein the ratio of the actuation force on the power supply to the input force on the handle to is about 10:1.

15. The actuation device of claim 9, wherein an actuation force on the power supply is about 100 pounds-force when an input force on the handle to is about 10 pounds-force.

16. A method for actuating a power supply into an electrical device, the method comprising:
    movably containing a power supply in a frame having an opening to receive the power supply therethrough;
    pivotally connecting a linkage mechanism to the frame;
    pivotally connecting a handle mechanism to each of the frame and the linkage mechanism, the handle mechanism comprising a handle having a first end and an opposite second end and a connection link having a first end and an opposite second end, wherein
       the first end of the handle is pivotally connected to the frame, the first end of the connection link is pivotally connected to the handle intermediate to the first end of the handle and the second end of the handle, and the second end of the connection link is pivotally connected to the linkage mechanism; and rotating the second end of the handle about an axis determined by a connection point of the first end of the handle to the frame to move the connection link in a first direction, thereby causing translation of the linkage mechanism in a second direction substantially perpendicular to the first direction to mechanically and electrically connect the power supply to an outside circuit through the opening of the frame.

\* \* \* \* \*